United States Patent [19]

Kondo

[11] Patent Number: 4,476,457
[45] Date of Patent: Oct. 9, 1984

[54] ROTARY ENCODER
[75] Inventor: Shiroh Kondo, Sagamihara, Japan
[73] Assignee: Alps Electric Co., Ltd., Japan
[21] Appl. No.: 349,152
[22] Filed: Feb. 16, 1982
[30] Foreign Application Priority Data Feb. 17, 1981 [JP] Japan .................................. 56-21899

[51] Int. Cl.³ .......................... G01D 5/34; H03D 13/00
[52] U.S. Cl. ........................... 340/347 P; 250/231 SE; 340/347 M
[58] Field of Search ....................... 340/347 M, 347 P; 250/231 SE

[56] References Cited
U.S. PATENT DOCUMENTS 4,184,071 1/1980 Fryer et al. .................... 250/231 SE Primary Examiner—T. J. Sloyan
Attorney, Agent, or Firm—Guy W. Shoup

[57] ABSTRACT

A rotary encoder for producing a pair of pulse trains with a desired phase difference therebetween is provided. The encoder comprises a rotary plate provided with a plurality of slits arranged in the form of a ring and a stationary slit plate provided with two sets of slits spaced apart at a particular distance. In accordance with the present invention, a single light source and a pair of light-receiving elements are provided, and the rotary and stationary slit plates are provided such that their distance may be appropriately adjusted. With such a structure, a phase difference between the two signals obtained by the light-receiving elements may be precisely adjusted to an intended value.

9 Claims, 7 Drawing Figures

ROTARY ENCODER

BACKGROUND OF THE INVENTION

1. Field of the Invention

The present invention relates to a rotary encoder and in particular to a rotary encoder for producing two pulse trains with a desired phase difference therebetween. In applications, a rotary encoder of the present invention may be used in a driving system for an image sensor head of a facsimile machine or a recording head of a printer as coupled to a motor, pulley or wire guide in the driving system, thereby detecting the scanning position, scanning speed, scanning direction, etc. of such a head.

2. Description of the Prior Art

A rotary encoder for producing two pulse trains to control the operation of a reader or recorder head in a facsimile or printing machine is well known in the art. A typical example of such a prior art rotary encoder is schematically shown in FIGS. 1 through 3. Such a rotary encoder usually comprises a rotary plate and a stationary slit plate. FIG. 1 shows a rotary plate 1 which is circular is shape and which is provided with a plurality of slits 2 equally spaced apart from each other. The slits 2 are provided to the plate 1 to allow the passage of light therethrough and arranged in the form of a ring. Thus, the outer edges of the slits 2 are located at a radius a from the center 0 of rotation of the plate 1 and their inner edges are all located at a radius b from the center 0.

FIG. 2 shows a stationary slit plate 10 which is to be used in combination with the rotary plate 1. The stationary slit plate 10 is also provided with a first set 11 of slits and a second set 12 of slits, each set having the same number of slits which are structurally the same as the slits 2 of the rotary plate 1. It is to be noted, however, that the relative positional relationship between the first and second slit sets 11 and 12 is such that when the slits of the first set 11 are precisely aligned with the slits 2 of the rotary plate 1, the slits of the second set 12 are misaligned with the slits 2 by a quarter of the slit pitch.

As shown in FIG. 3, the stationary slit plate 10 is disposed above the rotary plate 1 such that the slits of the first and second sets 11 and 12 may be brought into alignment with some of the slits 2 alternately. Disposed above the stationary slit plate 10 are first and second light emitting elements 31 and 32 such as L.E.D's.; whereas, disposed below the rotary plate 1 are first and second light receiving elements 21 and 22 such as photodiodes. Accordingly, the first light receiving element 21 may receive light emitted from the first light emitting element 31 through the slits of the first set 11 and the slits 2. Likewise, the second light receiving element 22 may receive light emitted from the second light emitting element 32 through the slits of the second set 12 and the slits 2. It should be noted that the rotary plate 1 may be rotated clockwise or counter-clockwise with respect to the stationary slit plate 10 as indicated by the solid line and dotted line arrows.

Under the circumstances, when the rotary plate 1 is rotated to cause relative movement between the slits 2 and the slits of the first and second sets 11 and 12, the first and second light receiving elements 21 and 22 supply output signals shown by waveforms E and F in FIG. 4. These waveforms E and F may be converted into pulse trains e and f by a well-known method. It is to be noted that there is a phase difference of 90° between the pulse trains e and f. In FIG. 4, "T" indicates time, and "N" and "R" indicate rotational direction of the rotary plate 1 with "N" indicating normal rotation and "R" indicating reversed rotation. Thus, when the rotary plate 1 is in normal rotation, the pulse train e is 90° ahead of the pulse train f; whereas, when the rotary plate 1 is in reversed rotation, the pulse train f is 90° ahead of the pulse train e. This leads to the fact that, by detecting the phase difference between the pulse trains e and f, the rotational direction of the rotary plate 1 may be determined. Moreover, the rotational speed and the amount of rotation of the rotary plate 1 may be determined by using at least either one of the pulse trains e and f.

When the slit pitch is small and/or the rotational speed of the rotary plate 1 is high, the cycle of the pulse trains e and f is short so that the phase difference between the two pulse trains e and f is difficult to detect. In other words, it is now required to detect pulse edges of the pulse trains e and f at high speed. Such a difficulty mainly stems from such reasons as possible manufacturing errors in the slits; possibly differing photoemitting characteristics between the two light emitting elements 21 and 22; possibly differing photosensitivity characteristics between the two light receiving elements 31 and 32; and possibly differing conversion characteristics in converting the analog signals E and F into pulse trains e and f, respectively.

Because of the above, the phase difference between the two pulse trains e and f cannot be precisely set at 90° and it also fluctuates due to dimensional errors in individual slits. As the actual phase difference deviates more from the intended value of 90°, it becomes more difficult to determine the rotational direction of the rotary plate 1 and a probability of erroneous determination increases. In particular, when the slit pitch is small and/or the rotational speed of the rotary plate 1 is high, the amount of deviation from the intended phase difference of 90° becomes more material in the accurate determination of the rotational conditions of the rotary plate 1 because the cycle of the pulse train e, f is short. The phase difference is also sensitive to the distance between the rotary plate 1 and the stationary slit plate 10 as well as to position and orientation of the light emitting 21, 22 and receiving 31, 32 elements. Accordingly, in accordance with the prior art, an elaborate and time-consuming step of precise positioning of elements is required.

SUMMARY OF THE INVENTION

The above-described disadvantages are overcome with the present invention which provides a rotary encoder capable of producing two pulse trains with an intended phase difference therebetween. In accordance with the present invention, there is provided a rotary encoder which comprises a first plate which is rotatably supported in the plane defined by its surface and which is provided with a plurality of slits spaced apart from each other and arranged in the form of a ring; driving means for driving to rotate said first plate; a second plate disposed at one side of said first plate and provided with a first set of slits and a second set of slits, said first and second slit sets having the same predetermined number of slits; a light source disposed at the side opposite to said one side of said first plate; a pair of light-receiving elements the first of which is disposed to receive light from said light source through the slits of said first plate and the first set of slits of said second plate and the second of which is disposed to receive light from said light source through the slits of said first plate and the second set of slits of said second plate; and adjusting means for adjusting the position of either one or both of said first and second plates with respect to said pair of light-receiving elements.

In accordance with one embodiment of the present invention, the driving means includes a driving motor having a driving shaft and the first plate is so mounted on the driving shaft that the position of the first plate may be adjusted along the axis of the driving shaft. In accordance with another embodiment of the present invention, the adjusting means includes a first positioning member having a first threaded portion and fixed to said driving shaft, a second positioning member, to which the first plate is fixed, having a second threaded portion engageable with the first threaded portion, and fastening means for releasably fastening the second positioning member to the driving shaft.

It is therefore an object of the present invention to provide a rotary encoder which allows to obtain an intended phase difference between a pair of pulse trains.

Another object of the present invention is to provide a rotary encoder which has a simplified arrangement of elements.

A further object of the present invention is to provide a rotary encoder which is compact in size and thus easy to manufacture.

Other objects, advantages and novel features of the present invention will become apparent from the following detailed description of the invention when considered in conjunction with the accompanying drawings.

DESCRIPTION OF THE PREFFERED EMBODIMENTS

Figure 1:
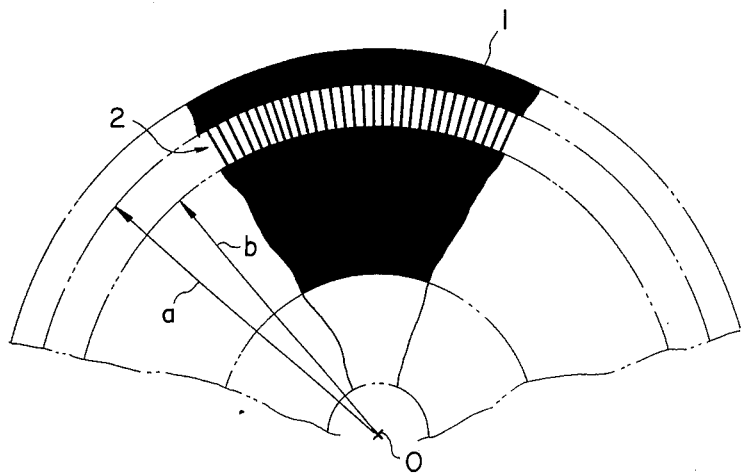
FIG. 1 is a fragmentary top plan view showing a part of the rotary plate 1 in accordance with the prior art.
Figure 2:
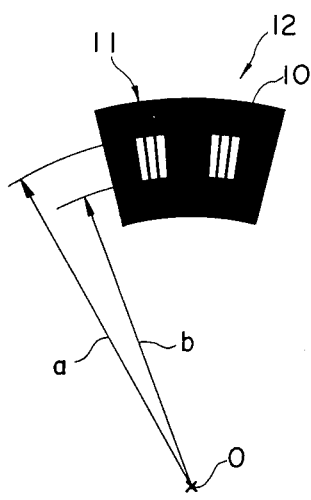
FIG. 2 is a top plan view of the stationary slit plate 10 in accordance with the prior art.
Figure 3:
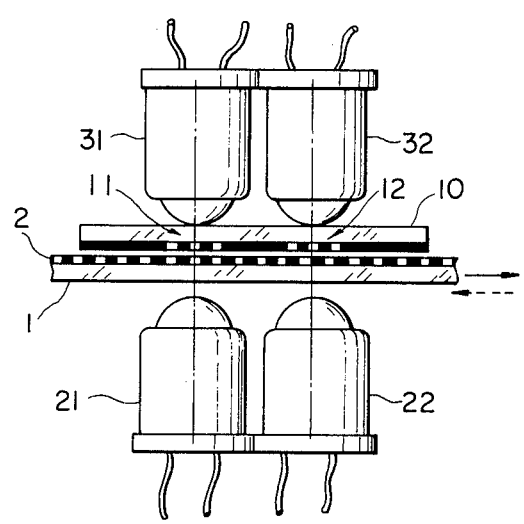
FIG. 3 is a schematic illustration showing the light emitting elements 31, 32 and light receiving elements 21, 22 arranged on respective sides of the rotary plate 1 and the stationary slit plate 10 in accordance with the prior art.
Figure 4:
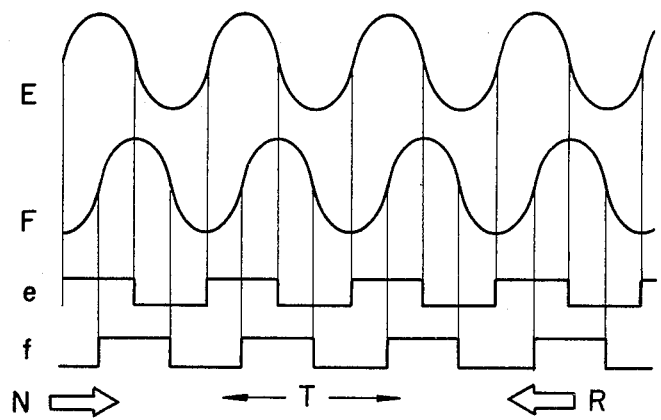
FIG. 4 is a timing chart showing a pair of analog signals obtained from the light receiving elements and a pair of pulse trains converted from the analog signals which may be used for determining the rotating conditions of the rotary plate 1.

It is to be noted that the embodiment of the present invention disclosed herein employs the similar rotary and stationary plates disclosed in FIGS. 1 and 2, respectively, and that like numerals indicate like elements.

Figure 5:
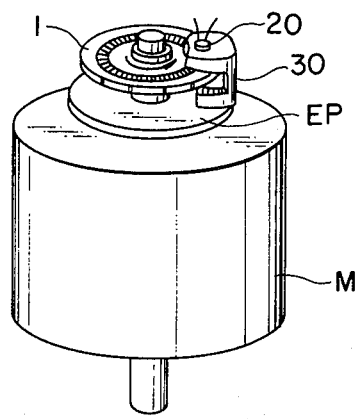
FIG. 5 is a perspective view showing a rotary encoder embodying the present invention.

As shown in FIG. 5, in accordance with one embodiment of the present invention, the rotary plate 1 is releasably fixed to the driving shaft of a driving motor M. A support member 30 is fixedly mounted on an end plate EP which is fixed to the housing of the motor M. The support member 30 is provided with a recess into which a part of the rotary plate 1 is inserted. The support member 30 supports a single light emitting diode 20 on one side of the rotary plate 1 and the stationary slit plate 10 and a pair of photodiodes 31 and 32 on the other side of the rotary plate 1. Therefore, the photodiodes 31 and 32 disposed at the bottom of the recess may receive light emitted from the light emitting diode 20 through the slits 2 of the rotary plate 1 and through the first set slit 11 and through the second set of slits 12 respectively. The support member 30 together with L.E.D. 20, slit plate 10 and photodiodes 31, 32 constitutes a photosensor unit.

Figure 6:
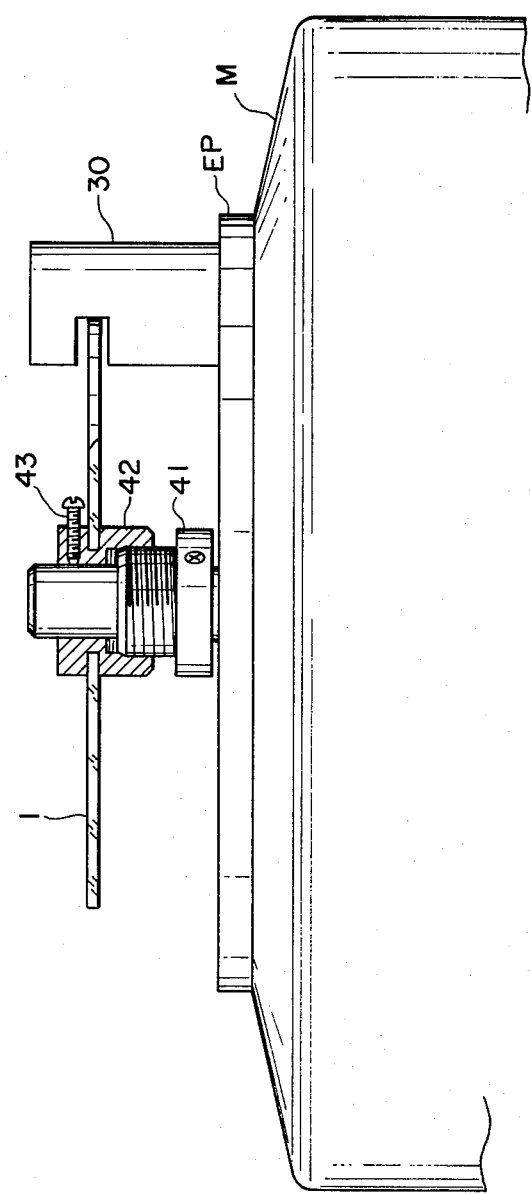
FIG. 6 is an enlarged and partially cross-sectional view showing the detailed structure in which the position of the rotary plate 1 may be adjustably selected along the axis of the driving shaft in accordance with one embodiment of the present invention.

As shown in FIG. 6, fixedly mounted on the driving shaft of the motor M is a first positioning member 41 which has a male-threaded portion. The rotary plate 1 is provided with a central through-hole to which a second positioning member 42 is fixed. The second positioning member 42 has a female-threaded portion into which the male-threaded portion of the first positioning member 41 may be screwed. The second positioning member 42 is also provided with a screw 43 and, therefore, the second positioning member 42 may be temporarily fixed to the driving shaft of the motor M by tightening the screw 43.

By untightening the screw 43, the second positioning member 42 may be rotated clock-wise or counter-clockwise against the first positioning member 41 fixed to the driving shaft of the motor M so that the rotary plate 1 may change its position along the axis of the driving shaft of the motor M. Such a change in axial position of the rotary plate 1 is indicated by the reference character G in FIG. 7. By changing the axial position of the rotary plate 1 as described above, the relative distance 1 between the rotary plate 1 and the stationary slit plate 10 may be easily adjusted, thereby allowing to obtain an intended phase defference between a pair of pulse trains produced. Upon completion of adjustment, the screw 43 may be tightened to fix the second positioning member 42 to the driving shaft of the motor M.

Figure 7:
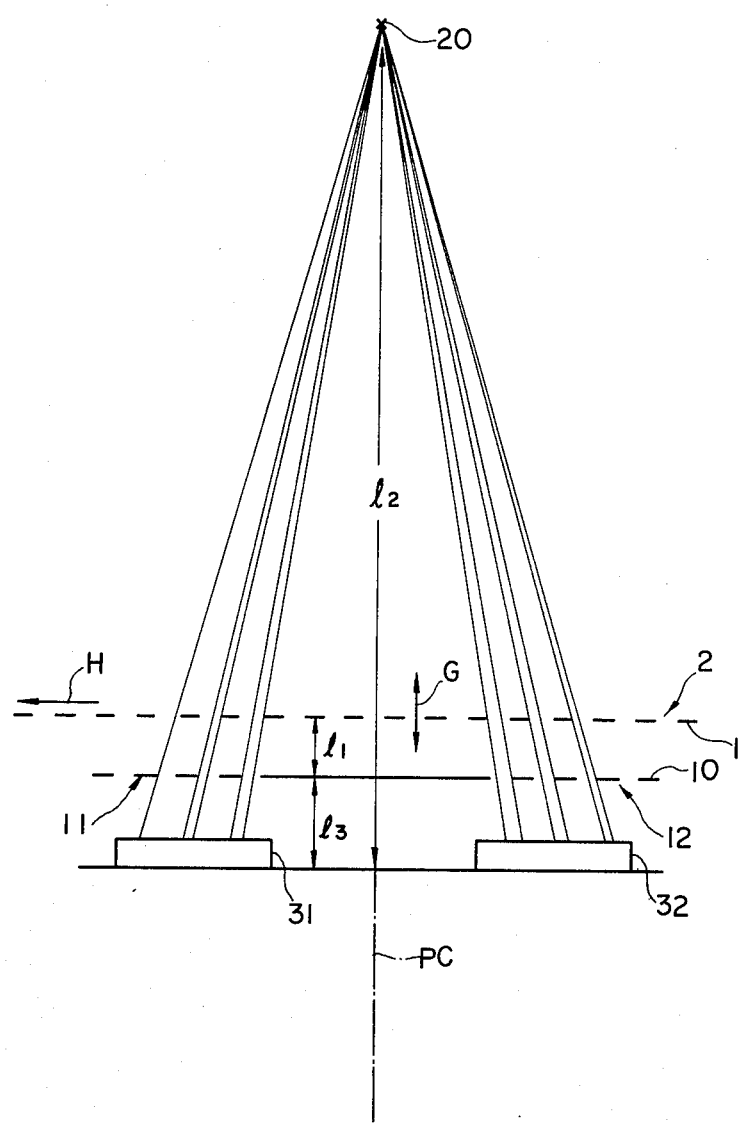
FIG. 7 is a schematic illustration showing the case in which use is made of a single light source for a pair of light receiving elements in accordance with one embodiment of the present invention.

FIG. 7 schematically shows the principle of the present invention. As shown, there is provided a single light source 20 which is located approximately at a center between the two sets 11, 12 of slits provided in the stationary slit plate 10. At least one of the rotary plate 1 and the stationary plate 10 is provided to be adjustable in position toward or away from the other in order to precisely set a phase difference between a pair of pulse trains at a desired value.

In the structure shown in FIG. 7, both of the photodiodes 31 and 32 receive light from the same light source 20, and the phase difference between a pair of pulse trains formed by signals from the photodiodes 31 and 32 is dependent upon three relative positional relationships: distance l1 between the rotary plate 1 and the stationary slit plate 10, distance l2 between the light source 20 and the photodiode mounting surface, and distance l3 between the stationary slit plate 10 and the photodiode mounting surface. Besides, in an actual light emitting diode, there is a light intensity distribution in the direction normal to an optical axis PC and such distribution also varies along the axis PC, which also constitutes another factor causing to change a phase difference.

Suppose that the rotary plate 1 is in rotation in the direction indicated by the arrow H. Under the condition, when the rotary plate 2 is moved away from the stationary slit plate 10 along the axis PC, a phase for the amount of light received by the photodiode 31 advances; whereas, a phase for the amount of light received by the photodiode 32 delays. On the other hand, if the rotary plate 2 is moved closer to the stationary slit plate 10, the photodiode 31 receives light in delayed phase and the photodiode 32 receives light in advanced phase. It is to be noted that similar adjustments in phase difference may be carried out by moving the stationary slit plate 10 along the axis PC with holding the rotary plate 1 stationary along the axis PC. In this manner, in accordance with the present invention, it is made possible to obtain a phase difference having an intended value by using the single light source and providing the rotary plate and the stationary slit plate at least one of which may be adjustably positioned closer to or away from the other.

It should be appreciated that the number of elements required is decreased as compared with the prior art. And the conventional rotary and stationary slit plates may be used without changes. Moreover, the manufacturing error in the relative distance between the first and second sets of slits are not critical because such an error is effectively corrected by the adjusting mechanism of the present invnetion. It should also be noted that the required adjustment in phase difference may be carried out even after assemblage to a driving system.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A rotary encoder for producing output signal having a variable phase difference, comprising:
    a first plate which is rotatably supported and which is provided with a reference indicium of alternate non-light-transmitting and light-transmitting sections arranged at a predetermined pitch circularly around an axis of rotation of said plate;
    driving means for rotating said first plate in a plane defined by its surface;
    a light source for irradiating light radially from said light source to said first plate;
    a second plate which is provided with a pair of first and second indicia, each including at least one light transmitting section, said first and second indicia being arranged such that when either one of said first and second indicia is in phase with said reference indicium, the other is shifted in phase with said reference indicium with respect to the direction of movement of said reference indicium, and that said first and second indicia receive said light from said light source through said reference indicia at differing incidence angles;
    a pair of first and second light-receiving elements, said first light-receiving element being disposed to receive said light as passed through reference and said first indicia, and said second light-receiving element being disposed to receive said light as passed through said reference and said second indicia; and
    adjusting means for adjusting the position of at least one of said first and second plates variable with respect to the other and said light source such that a ratio between a distance from said light source to said first plate and a distance from said light source to said second plate is varied thereby correspondingly varying the relative phase of said output signals.

2. A rotary encoder as in claim 1 wherein said first plate is circular in shape and said reference indicium is defined along the periphery of said circular first plate.

3. A rotary encoder as in claim 1 wherein said driving means includes a driving motor having a driving shaft, and said first plate mounted on said driving shaft adjustably in position along the axis of said driving shaft with respect to said light source and second plate is provided fixed in position.

4. A rotary encoder as in claim 2 wherein said light-transmitting sections of said reference, first and second indicia are substantially identical in shape and size.

5. A rotary encoder as in claim 3 wherein said adjusting means includes a first positioning member having a first threaded portion and fixed to said driving shaft, a second positioning member, to which said first plate is fixedly mounted, having a second threaded portion engageable with said first threaded portion, and fastening means for releasably fastening said second positioning member to said driving shaft.

6. A rotary encoder as in claim 4 wherein each of said first and second indicia includes a plurality of said light-transmitting sections arranged at said predetermined pitch corresponding with said reference indicium.

7. A rotary encoder as in claim 5 further comprising a support member fixedly mounted on an end plate of said driving motor for supporting said light source and said second plate fixed in position.

8. A rotary encoder as in claim 6 wherein each of said light-transmitting sections is defined by a slit.

9. A rotary encoder as in claim 7 wherein said light source is located equidistantly from both of said first and second indicia.

* * * * *

UNITED STATES PATENT AND TRADEMARK OFFICE
CERTIFICATE OF CORRECTION

PATENT NO. : 4,476,457
DATED : October 9, 1984
INVENTOR(S) : Shiroh Kondo

It is certified that error appears in the above-identified patent and that said Letters Patent is hereby corrected as shown below:

On the first page change the Assignee from "Alps Electric Co., Ltd., Japan" to --Ricoh Company, Ltd., Japan--.

Signed and Sealed this

First Day of October 1985

[SEAL]

Attest:

DONALD J. QUIGG

Attesting Officer

Commissioner of Patents and
Trademarks—Designate